United States Patent [19]

Tsujii

[11] Patent Number: 4,553,154
[45] Date of Patent: Nov. 12, 1985

[54] LIGHT EMITTING DIODE ELECTRODE

[75] Inventor: Katsumi Tsujii, Nara, Japan

[73] Assignee: Sharp Kabushiki Kaisha, Osaka, Japan

[21] Appl. No.: 681,710

[22] Filed: Dec. 13, 1984

Related U.S. Application Data

[63] Continuation of Ser. No. 337,289, Jan. 5, 1982, abandoned.

[30] Foreign Application Priority Data

Jan. 13, 1981 [JP] Japan ................................. 56-4494
Jan. 13, 1981 [JP] Japan ................................. 56-4495

[51] Int. Cl.[4] .......................................... H01L 23/48
[52] U.S. Cl. .................................. 357/71; 357/71; 357/54
[58] Field of Search ............... 357/54, 71, 71 P, 71 S

[56] References Cited

U.S. PATENT DOCUMENTS 3,761,309 9/1973 Schmitter et al. ............... 357/71
3,879,746 4/1975 Fournier ........................... 357/71
3,923,559 12/1975 Sinha ............................ 357/54 X
4,316,201 2/1982 Christon ......................... 357/71
4,414,561 11/1983 Keramidas ...................... 357/71
4,417,387 11/1983 Heslop ........................... 357/71

Primary Examiner—Martin H. Edlow
Attorney, Agent, or Firm—Birch, Stewart, Kolasch & Birch

[57] ABSTRACT

An electrode adapted for a semiconductor device, comprises an alloy layer formed with a gold basis, the alloy layer being disposed on the semiconductor device to provide an ohmic contact with the semiconductor device, a TiN layer, a Ti layer, and an Al layer which is bonded to an external terminal for the semiconductor device.

12 Claims, 5 Drawing Figures

LIGHT EMITTING DIODE ELECTRODE

This application is a continuation of application Ser. No. 337,289, filed on Jan. 5, 1982, abandoned.

BACKGROUND OF THE INVENTION

The present invention relates to light emitting diodes (LEDs) and, more particularly, to an electrode structure for such LEDs as III–V compounds inclusive of GaP, GaAs, GaAs, $GaAs_{1-x}P_x$, $Ga_{1-x}Al_xAs$ and the like.

The conventional III–V compound LED comprises an N-type layer and a P-type layer both of which are grown with liquid phase epitaxy on an N-type wafer. The wafer is made with liquid encapsulated Czochralski method. An alloy such as Au-Be or Au-Zn is deposited upon the P-type layer as an ohmic contact electrode. Another alloy such as Au-Si or Au-Ge is deposited upon the N-type layer as the ohmic contact electrode. The P-type layer electrode is wire bonded with a gold wiring member to a conductive member by applying pressure and heat thereto.

The surface condition of the P-type layer electrode is determinative of whether the wire bonding with the gold wiring provides good adhesion. The metal of Zn or Be added to Au prevents the gold wiring from being tightly bonded to the electrode surface, thereby preventing good wire-bonding. Ga may possibly diffuse from the semiconductor substrate into the electrode due to the heat application procedure, preventing the gold wiring from being tightly bonded.

On the other hand, Al wirings adapted for Si devices can provide good wire bonding. However, the Al wirings can not provide good ohmic contact to III–V compounds, in particular, low impurity concentration layers such as GaP and GaAs which are made with liquid phase epitaxy.

Therefore, an improved electrode structure for providing good wire bonding and good ohmic contact is desirable.

SUMMARY OF THE INVENTION

With the foregoing in mind, it is an object of the present invention to provide an improved electrode structure adapted for a III–V compound LED, the electrode providing good wire bonding and ohmic contact.

It is another object of the present invention to provide an improved multi-layered electrode adapted for a III–V compound LED, the multi-layered electrode providing good wire bonding and ohmic contact.

Briefly described, in accordance with the present invention, an electrode adapted for a semiconductor device, comprises, an alloy layer formed with a gold basis, the alloy layer being disposed on the semiconductor device to provide an ohmic contact with semiconductor device, a TiN layer, a Ti layer, and an Al layer which is bonded to an external terminal for the semiconductor device.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE INVENTION

As far as III–V compounds are concerned, materials for a III–V compound LED of the present invention can be freely selected. For convenience, the present invention is described with reference to GaP. However, other compounds such as GaAs, $GaAs_{1-x}P_x$, $Ga_{1-x}Al_xAs$ and the like can be adopted.

Throughout the drawings, like elements are indicated by like numerals.

Figure 1:
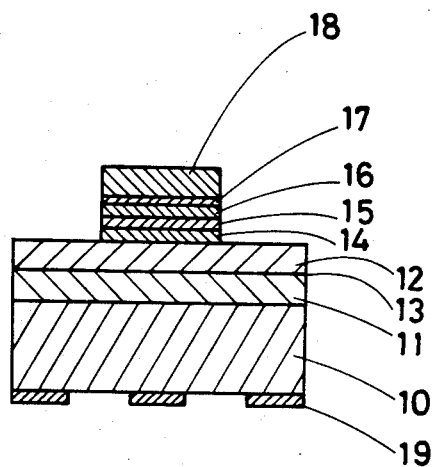
FIG. 1 shows a cross-sectional view of a specific example of LEDs according to the present invention.

With reference to FIG. 1, an LED of the present invention comprises an N-type GaP substrate 10, an N-type GaP layer 11 and a P-type GaP layer 12. The GaP substrate 10 is prepared with liquid encapsulated Czochralski (LEC) method. The layers 11 and 12 are grown with liquid phase epitaxy. A P-N junction 13 is then formed. The outer surfaces of the P-type layer 12 and the N-type substrate 10 are polished so that the thickness of these layers is controlled.

On the rear side of the N-type substrate 10, an electrode of Au-Si alloy is evaporated and photo-etched to shape a desirable pattern. An ohmic contact of the Au-Si electrode is prepared with heating to about 500°–600° C. in an atmosphere of nitrogen.

Upon the P-type layer 12, five layers 14–18 are disposed as an electrode. The materials and the thickness of these layers are summarized in Table I:

| Layer | Material | Thickness (about) |
|---|---|---|
| 14 | Au—Be | 500–5,000Å |
| 15 | TiN | 150–1,000Å |
| 16 | Ti | 1,000–5,000Å |
| 17 | TiN | 150–1,000Å |
| 18 | Al | 0.8–2.0 μm |

The Au-Be layer 14 contains Be of 0.2–1.0 weight %. Each of the TiN layers 15 and 17 is prepared with reactive sputtering to a Ti target in an atmosphere of $N_2$. All of these layers 14 to 18 can be successively formed with sputtering in which case three kinds of target Au-Be, Ti and Al should be disposed. All of them can be evaporated or formed in any other way.

Figure 2A:
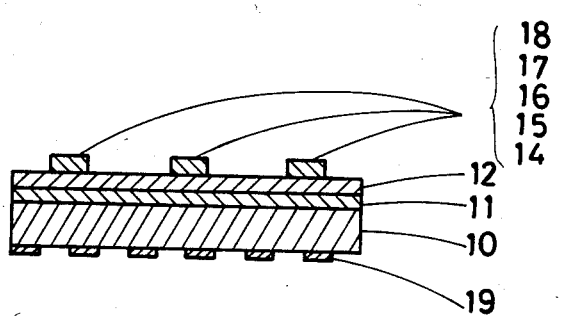
FIGS. 2(A) to 2(C) show steps for manufacturing LED of the present invention.
Figure 2B:
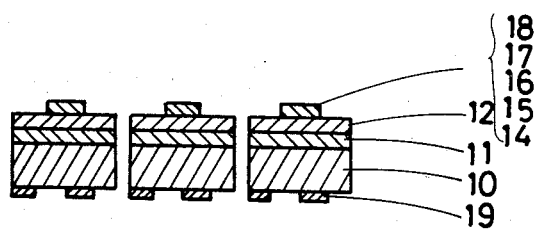
Figure 2C:
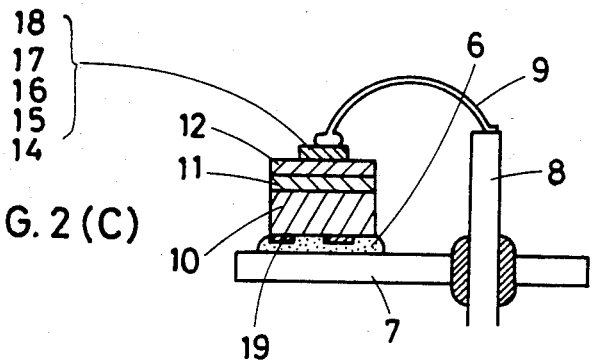

The thus prepared LED is finished as viewed in FIGS. 2(A) to 2(C). As FIG. 2(A) shows, the five electrode layers 14 to 18 are photo-etched to form a desirable shape. An etching solution for the Al layer 18 is $H_3PO_4$ heated at about 80°–90° C. The etching solution for the TiN layers 15 and 17, and the Ti layer 16 is a combination of $NH_4OH$ and $H_2O_2$. The etching solution for the Au-Be layer 14 is a combination of $I_2$ and $NH_4I$. The layers are heated at about 420°–500° C. to prepare the ohmic contact electrode.

As FIG. 2(B) shows, the thus prepared LED wafer is diced or scribed to an appropriate size.

As FIG. 2(C) shows, the LED chip is fixed on a stem with an Au or Ag paste 6. Gold wiring 9 is wire bonded to the electrode layers 14 to 18 and to a post 8 of the stem 7 by applying pressure and heat. The upper side of the stem 7 is sealed with an epoxy or the like to complete and LED lamp.

The five electrode layers 14 to 18 show good wire bonding and ohmic contact. The reason therefor is considered to be as follows:

The intermediate layers of TiN-Ti-TiN can prevent Au and Be in the layer 14 and Ga in the GaP substrate from diffusing toward the electrode surface during the heat-application procedure for providing the ohmic contact. Thus, no impurity is introduced into the outermost Al layer 18. Further, the good ohmic contact is assured by stably alloying the Gap layer 12 and the Au-Be layer 14. If a single intermediate layer made of TiN of Ti is disposed between the the layers 14 and 18, it cannot prevent Au-Be and Al from reacting owing to the heat-application procedure. The Al layer 18 assures good wire bonding.

The Au-Be layer 14 can be replaced by an Au-Zn layer providing a good ohmic contact. The Au-Si layer 19 can be replaced by an Au-Ge layer providing a good ohmic contact.

Figure 3:
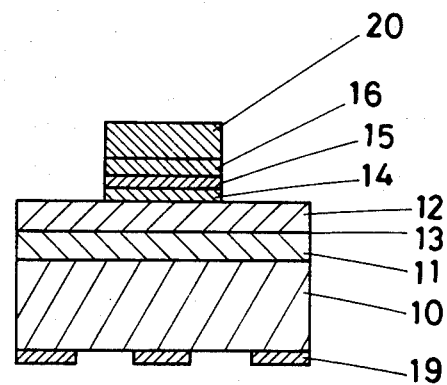
FIG. 3 shows a cross-sectional view of another specific example of LEDs according to the present invention.

FIG. 3 shown another specific example of LED according to the present invention. LED of FIG. 3 is similar to that of FIG. 2 except that four electrode layers 14 to 20 are disposed on the P-type GaP layer 12. The materials and the thickness of these four layers are summarized in Table II:

TABLE II

| layer | material | thickness (about) |
|---|---|---|
| 14 | Au—Be | 500–5,000Å |
| 15 | TiN | 500–2,000Å |
| 16 | Ti | 1,000–4,000Å |
| 20 | Al | 0.8–2.0 μm |

The TiN layer 15 and the Ti layer 16 are successively formed by sputtering the Ti target in the atmosphere of $N_2$ and then Ar. All of these layers 14 to 16 and 20 can be formed with sputtering, evaporation or the like.

The LED of FIG. 3 is completed in the manner as shown in FIGS. 2(A), 2(B) AND 2(C).

The fact that the four electrode layers 14 to 16 and 20 of FIG. 3 can show good wire bonding and ohmic contact is considered to be due to the same reason why the five electrode, layers 14 to 18 of FIG. 1 show good wire bonding and ohmic contact.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electrode adapted for a semiconductor device, comprising:
    a first layer being disposed on the semiconductor device and comprising material selected from the group consisting of Au-Be and Au-Zn for providing an ohmic contact with the semiconductor device;
    a second layer of TiN adjacent said first layer;
    a third layer of Ti adjacent said second layer;
    a fourth layer of Al adjacent said third layer of Ti; and an external lead for said semiconductor device bonded to said Al layer.

2. The electrode a claim 1, further comprising a further alloy layer formed of a material selected from the group consisting of Au-Si and Au-Ge, the further alloy layer also being disposed on the semiconductor device to provide an ohmic contact with the semiconductor device.

3. The electrode of claim 1, wherein the semiconductor device is a light emitting diode.

4. The electrode of claim 1, wherein the semiconductor device is of III–V compounds.

5. The electrode of claim 1, wherein the semiconductor device comprises GaP, GaAs, $GaAs_{1-x}P_x$, or 6. The electroce of claim 1, wherein said external lead comprises a gold lead bonded to said Al layer.

7. An electrode adapted for a semiconductor device, comprising:
    a first layer being disposed on the semiconductor device and comprising material selected from the group consisting of Au-Be and Au-Zn for providing an ohmic contact with the semiconductor device;
    a second layer of TiN adjacent said first layer;
    a third layer of Ti adjacent said second layer;
    a fourth layer of TiN adjacent said third layer;
    a fifth layer of Al adjacent said fourth layer; and
    an external lead for said semiconductor device bonded to said Al layer.

8. The electrode of claim 7, further comprising a further alloy layer formed of a material selected from the group consisting of Au-Si and Au-Ge, the further alloy layer being disposed on the semiconductor device to provide an ohmic contact with the semiconductor device.

9. The electrode of claim 7, wherein the semiconductor device is a light emitting diode.

10. The electrode of claim 7, wherein the semiconductor device is of III–V Compounds.

11. The electrode of claim 7, wherein the semiconductor device comprises GaP, GaAs, $GaAs_{1-x}P_x$ or $Ga_{1-x}Al_xAs$.

12. The electrode of claim 7, wherein said external lead comprises a gold lead bonded to said Al layer.

* * * * *